United States Patent [19]

Chappell et al.

[11] Patent Number: 4,845,677

[45] Date of Patent: Jul. 4, 1989

[54] PIPELINED MEMORY CHIP STRUCTURE HAVING IMPROVED CYCLE TIME

[75] Inventors: Barbara A. Chappell; Terry I. Chappell, both of Amawalk; Stanley E. Schuster, Granite Springs, all of N.Y.

[73] Assignee: International Business Machines Corporation, Armonk, N.Y.

[21] Appl. No.: 86,136

[22] Filed: Aug. 17, 1987

[51] Int. Cl.[4] .................... G11C 7/00; G11C 11/40
[52] U.S. Cl. ..................... 365/189.02; 365/230.03; 365/203
[58] Field of Search ............... 365/230, 187, 233, 203

[56] References Cited

U.S. PATENT DOCUMENTS

| | | | |
|---|---|---|---|
| 4,222,112 | 9/1980 | Clemons et al. | 365/189 |
| 4,384,347 | 5/1983 | Nakano | 365/189 |
| 4,390,946 | 6/1983 | Lane | 365/230 X |
| 4,410,964 | 10/1983 | Nordling et al. | 365/189 |
| 4,447,893 | 5/1984 | Murakami | 365/203 |
| 4,447,895 | 5/1984 | Shibaura et al. | 365/226 |
| 4,477,739 | 10/1984 | Proebsting et al. | 307/449 |
| 4,482,984 | 11/1984 | Oritani | 365/49 |
| 4,509,148 | 4/1985 | Asano et al. | 365/230 |
| 4,511,997 | 4/1985 | Nozaki et al. | 365/189 |
| 4,513,372 | 4/1985 | Ziegler et al. | 364/200 |
| 4,520,465 | 5/1985 | Sood | 365/203 |
| 4,542,486 | 9/1985 | Anami et al. | 365/230 |
| 4,554,646 | 11/1985 | Yoshimoto et al. | 365/189 |
| 4,562,555 | 12/1985 | Ouchi et al. | 365/233 |
| 4,569,036 | 2/1986 | Fujii et al. | 365/230 |
| 4,731,761 | 3/1988 | Kobayashi | 365/189 X |
| 4,740,923 | 4/1988 | Kaneko | 365/189 X |

OTHER PUBLICATIONS

1982 Digest of Technical Papers, Solid-State Circuits Conference IEEE "Tham 10.5: A 32b VLSI System" pp. 128-129 by J. W. Beyers et al.
IBM Technical Disclosure Bulletin, vol. 30, No. 7, Dec. 1987, "Self-Timed Pulsed Wordline"; B. A. Chappell et al.

Primary Examiner—Stuart N. Hecker
Assistant Examiner—Alyssa H. Bowler
Attorney, Agent, or Firm—John J. Goodwin

[57] ABSTRACT

A semiconductor random access memory chip wherein the cycle time is less than the access time for any combination of read or write sequence. The semiconductor random access memory chip is partitioned into relatively small sub-arrays with local decoding and precharging. The memory chip operates in a pipelined manner with more than one access propagating through the chip at any given time and wherein the cycle time is limited by sub-array cycles wherein the cycle time is less than the access time for a memory chip having cycle times greater than access times for accesses through the same sub-array. The memory chip also incorporates dynamic storage techniques for achieving very fast access and precharge times.

5 Claims, 10 Drawing Sheets

| FIG. 1A |
| FIG. 1B |

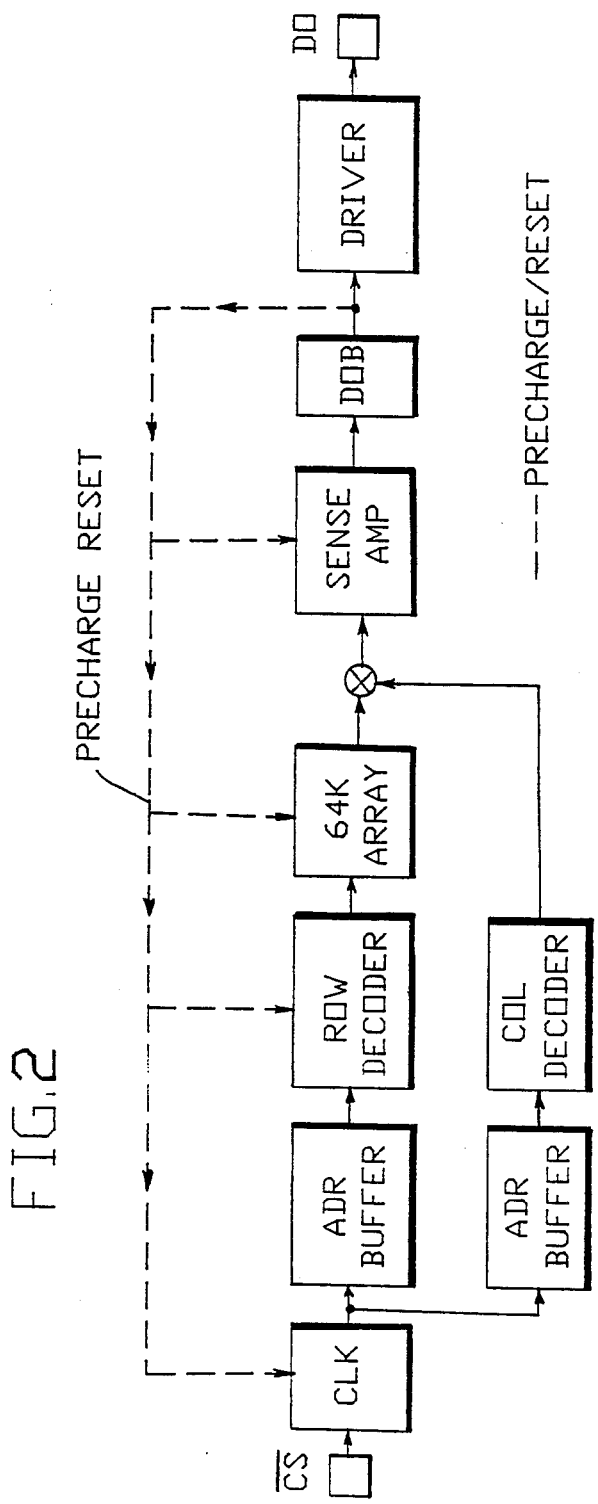

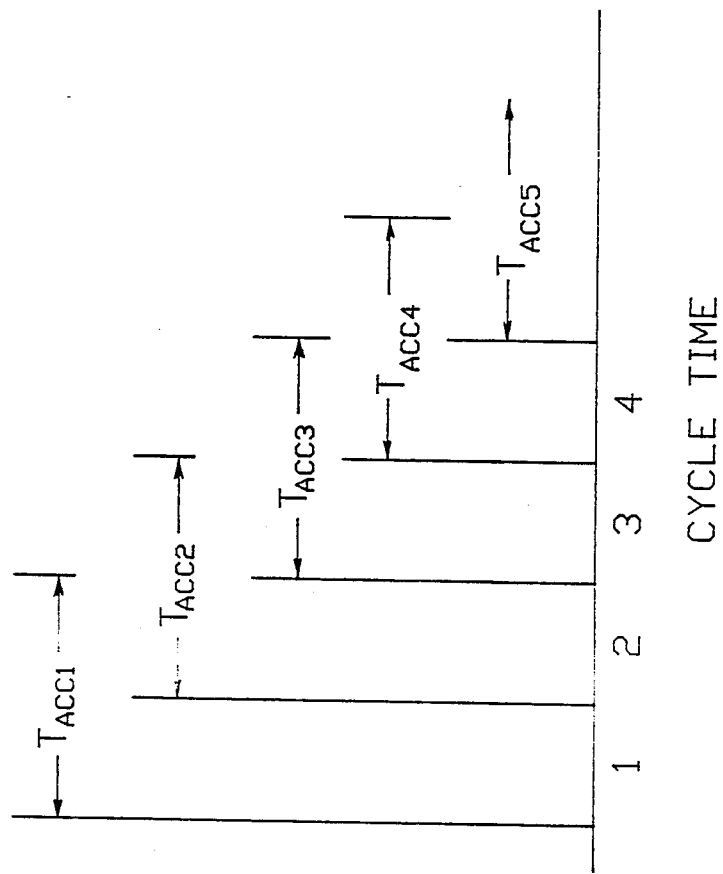

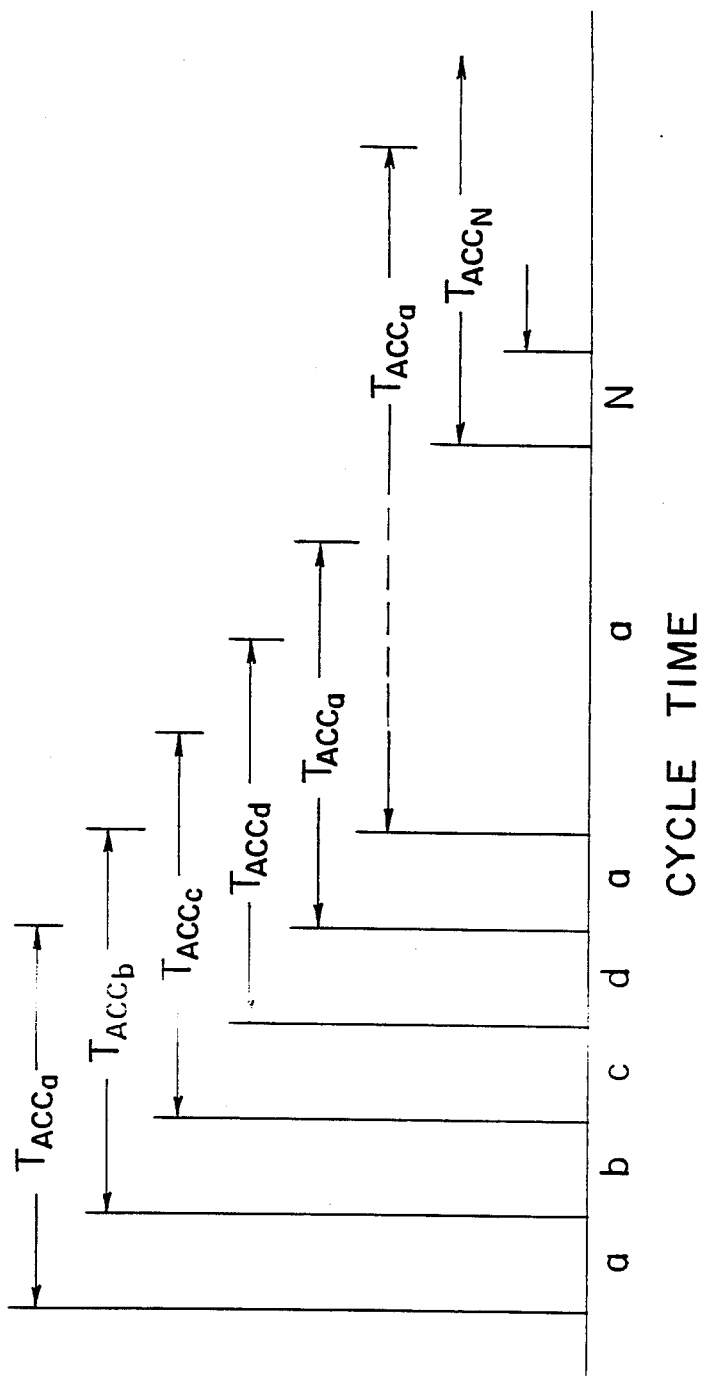

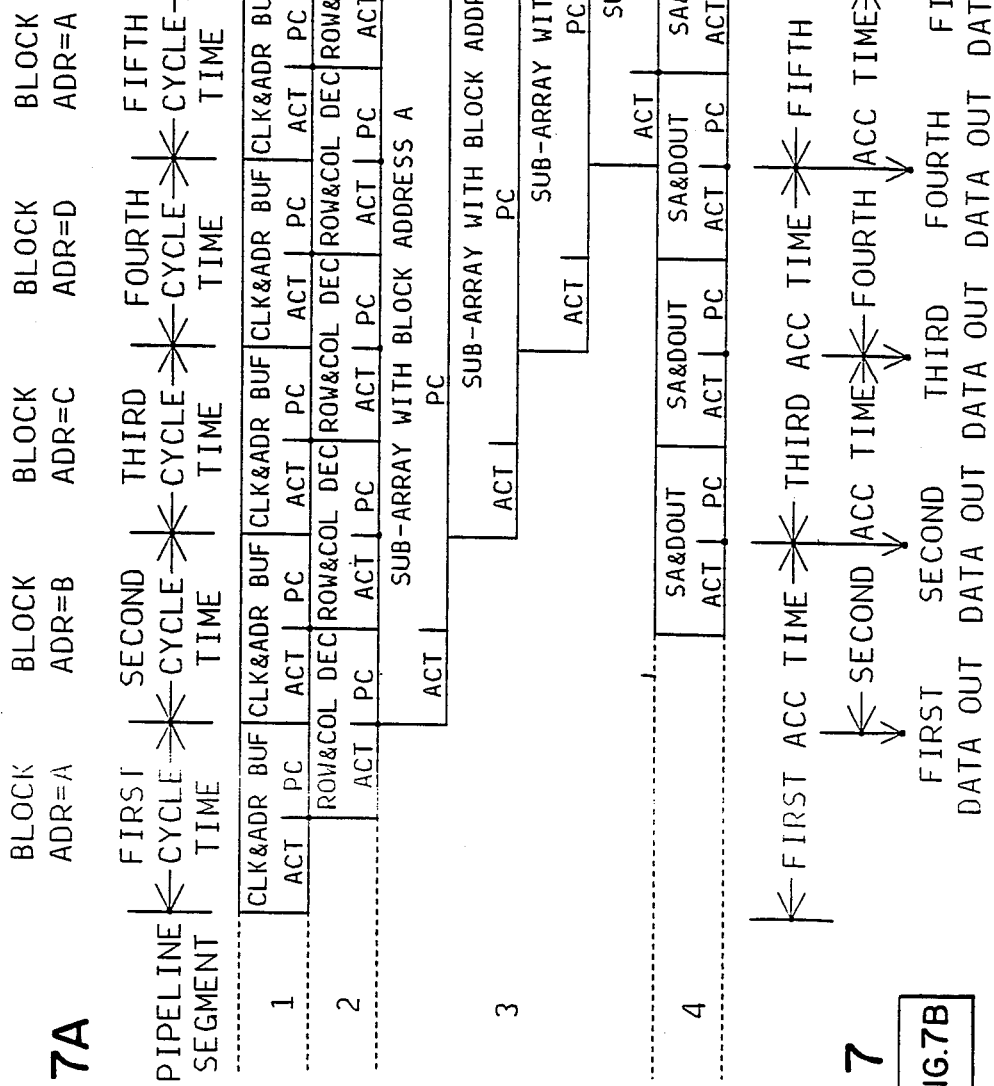

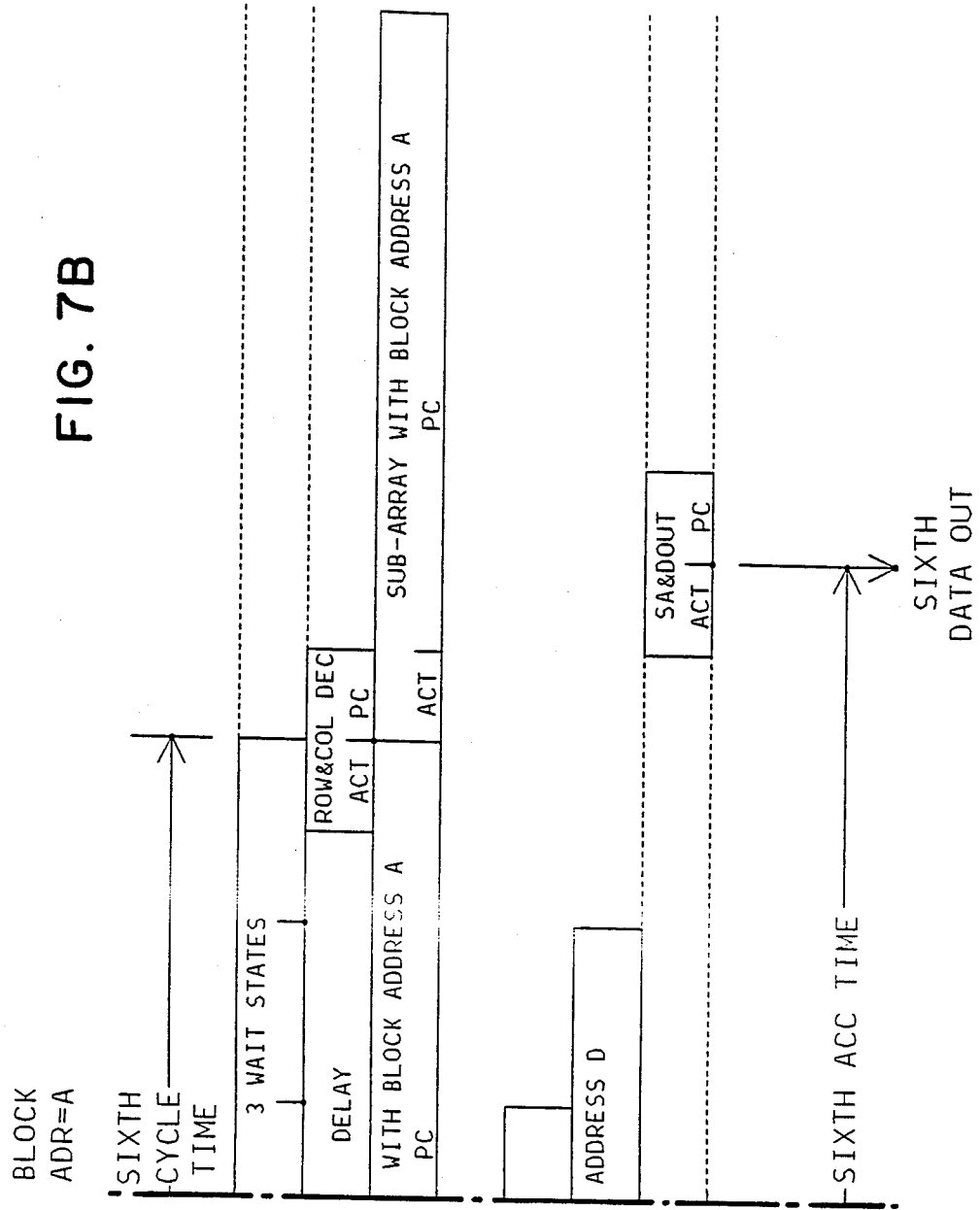

PIPELINED MEMORY CHIP STRUCTURE HAVING IMPROVED CYCLE TIME

BACKGROUND OF THE INVENTION

1. Field of the Invention

The present invention relates to semiconductor static and dynamic memory structures and more particularly, to a pipelined semiconductor memory chip divided into sub-arrays having globally and locally generated decoding and locally generated precharge signals.

2. Background Art

The present invention includes a number of particular techniques and structures which are related to general concepts found in the prior art. For example, the present invention employs a form of sub-array structure, uses multiplexed sense amplifiers and incorporates a precharge technique.

Representative prior art references which describe memories with sub-arrays, but not for pipelined operation, include U.S. Pat. No. 4,569,036, issued Feb. 4, 1986 to Fujii et al, entitled SEMICONDUCTOR DYNAMIC MEMORY DEVICE;

U.S. Pat. No. 4,554,646, issued Nov. 19, 1985 to Yoshimoto et al, entitled SEMICONDUCTOR MEMORY DEVICE;

U.S. Pat. No. 4,542,486, issued Sept. 17, 1985 to Anami et al, entitled SEMICONDUCTOR MEMORY DEVICE;

U.S. Pat. No. 4,482,984, issued Nov. 13, 1984 to Oritani, entitled STATIC TYPE SEMICONDUCTOR MEMORY DEVICE;

U.S. Pat. No. 4,447,895, issued May 8, 1984 to Asano et al, entitled SEMICONDUCTOR MEMORY DEVICE;

U.S. Pat. No. 4,384,347, issued May 17, 1983 to Nakano, entitled SEMICONDUCTOR MEMORY DEVICE;

U.S. Pat. No. 4,222,112, issued Sept. 9, 1980 to Clemons et al, entitled DYNAMIC RAM ORGANIZATION FOR REDUCING PEAK CURRENT.

References in the prior art directed to multiplexed sense amplifier input techniques include U.S. Pat. No. 4,511,997, issued Apr. 16, 1985 to Nozaki et al, entitled SEMICONDUCTOR MEMORY DEVICE;

U.S. Pat. No. 4,509,148, issued Apr. 2, 1985 to Asano et al, entitled SEMICONDUCTOR MEMORY DEVICE;

U.S. Pat. No. 4,477,739, issued Oct. 16, 1984 to Proebsting et al, entitled MOSFET RANDOM ACCESS MEMORY CHIP;

U.S. Pat. No. 4,447,893, issued May 8, 1984 to Murakami, entitled SEMICONDUCTOR READ ONLY MEMORY DEVICE;

U.S. Pat. No. 4,410,964, issued Oct. 18, 1983 to Nordling et al, entitled MEMORY DEVICE HAVING A PLURALITY OF OUTPUT PORTS.

Descriptions of techniques using precharge signals cependent upon a memory address are found in U.S. Pat. No. 4,520,465, issued May 28, 1985 to Sood, entitled METHOD AND APPARATUS FOR SELECTIVELY PRECHARGING COLUMN LINES OF A MEMORY and U.S. Pat. No. 4,513,372, issued Apr. 23, 1985 to Ziegler et al, entitled UNIVERSAL MEMORY.

"A 32b VLSI System", Joseph W. Beyers, et al, 1982, Digest of Technical Papers, 1982, IEEE International Solid-State Circuits Conference, pages 128–129, mentions that a 128 Kb RAM is pipelined.

SUMMARY OF THE INVENTION

An object of the present invention is to provide a semiconductor random access memory chip wherein the cycle time is less than the access time for any combination of read or write sequence.

Another object of the present invention is to provide a semiconductor random access memory chip grouped into a plurality of sub-arrays.

A further object of the present invention is to provide a semiconductor random access memory chip that is partitioned into relatively small sub-arrays with local decoding and precharging.

Still another object of the present invention is to provide a semiconductor random access memory chip including relatively small memory sub-arrays which are operated in a pipelined manner witn more than one access propagating through the chip at any given time and wherein the cycle time is limited by sub-array cycles. p A still further object of the present invention is to provide a semiconductor random access memory chip wherein the cycle time is less tnan tne access time for a memory chip naving cycle times greater than access times for accesses through the same sub-array.

Still another object of the present invention is to provide a semiconductor random access memory chip incorporating dynamic storage techniques for achieving very fast access and precharge times.

BRIEF DESCRIPTION OF THE DRAWINGS

FIG. 3-2 is a schematic illustration of a simplified depiction of a semiconductor memory chip similar to that of FIG. 3-1 including both a local precharge/reset technique and block address compare circuitry and further including a compare technique according to the principles of the present invention.

FIGS. 4 and 5 are illustrations of timing diagrams useful in describing the operation of the semiconductor memory structure of the present invention.

FIGS. 6 and 7(a) and 7(b) are block diagram illustrations of the pipeline segments in the access path of a semiconductor memory chip according to the principles of the present invention.

DISCLOSURE OF THE INVENTION

Figures 1, 1A:
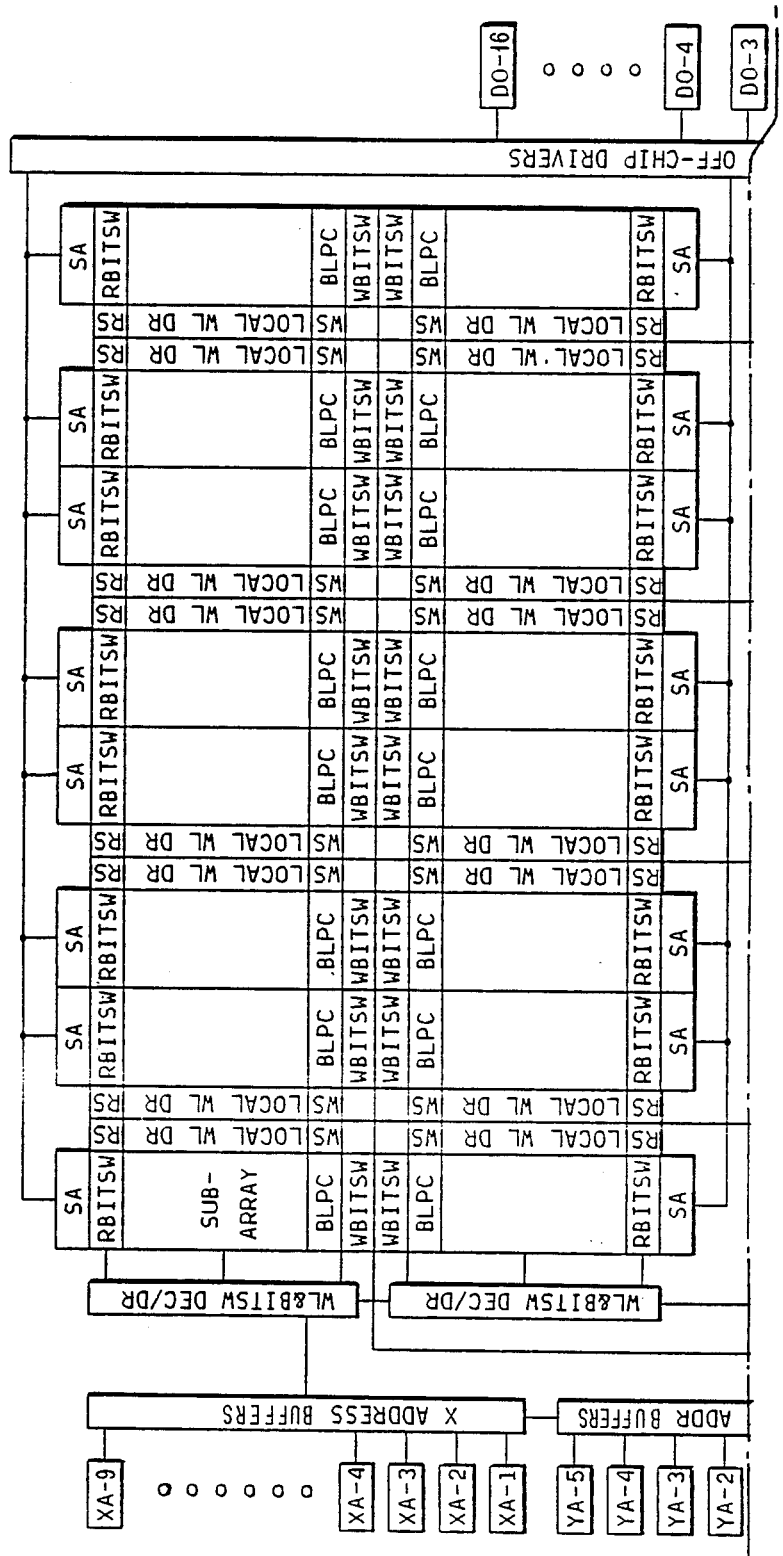
FIGS. 1(a) and 1(b) is a schematic illustrations of a 256K semiconductor memory chip partitioned into a plurality of sub-arrays including bitswitches, sense amplifiers, word line drivers and precharge circuits according to the principles of the present invention.
FIG. 3-1 is a schematic illustration of a simplified depiction of a semiconductor memory chip ncluding both a local precharge/reset technique and block address circuitry according to the principles of the present invention.
Figure 1B:
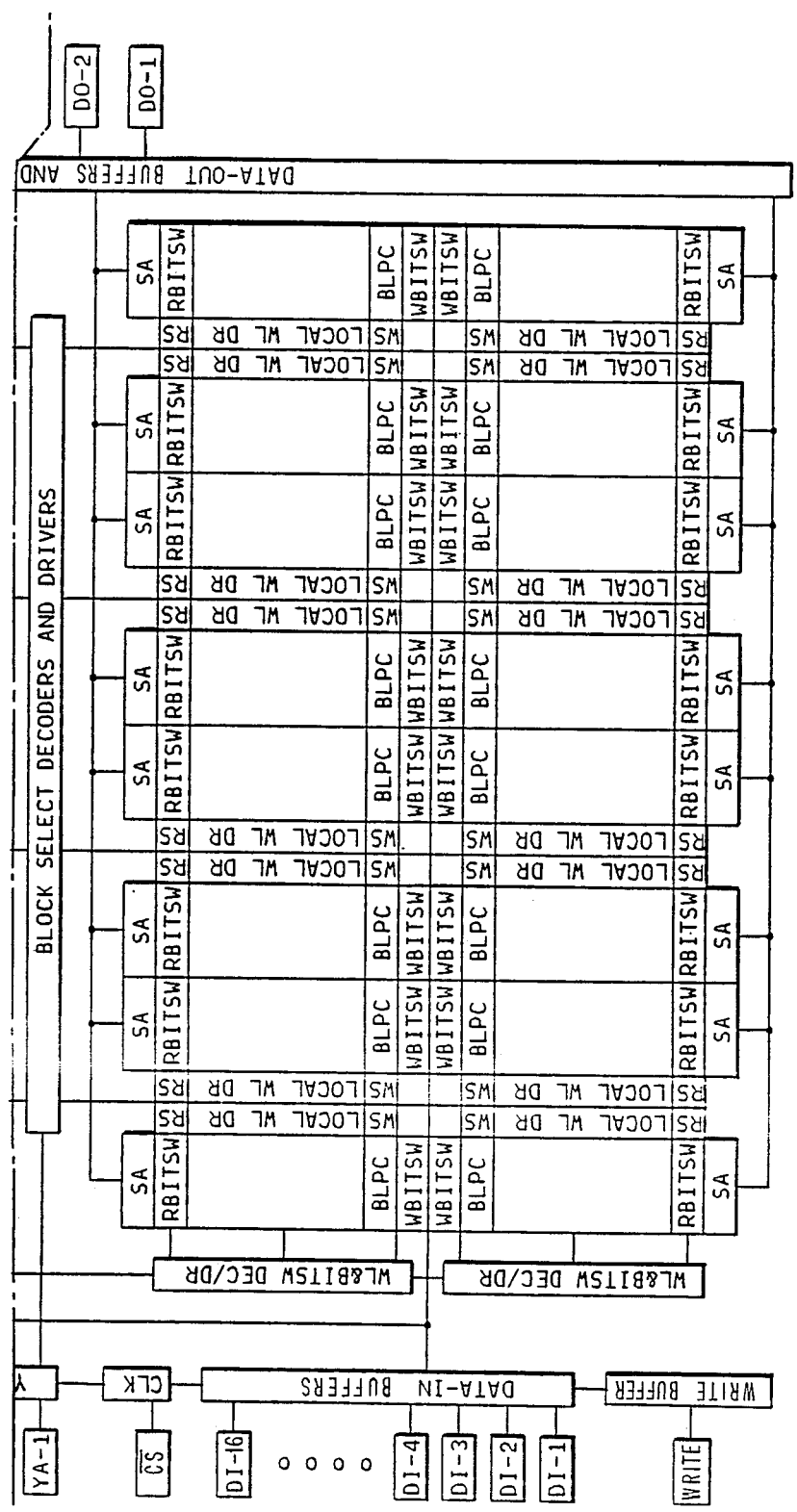

Referring to FIG. 1, a schematic illustration, referred to in the art as a floor plan, is shown for a 256K bit embodiment of a CMOS semiconductor chip for a cache memory according to the present invention.

The particular embodiment of the 256K bit chip shown in FIG. 1 uses a second level metal layer to partition the chip into thirty-two 8K bit sub-arrays. Each sub-array is organized as 128 word lines by 64 bitline pairs with 4-way bitswitches and 16 resistively decoupled, self-timed sense amplifiers which are located inboard, next to the sub-array because of the use of a second level metal layer. The structure uses standard CMOS memory cells composed of six devices. The present invention may include, however, embodiments using single layer metal as well as three, four or more metal layers.

More specifically, the 256K bit chip structure of FIG. 1 includes 32 sub-arrays arranged in 8 columns and 4 rows. The abbreviations used in FIG. 1 refer to the following elements.

|      | CS     | Chip Select Not Input           |           |
|------|--------|---------------------------------|-----------|
|      | SA     | Sense Amplifier                 |           |
|      | BITSW  | Bitswitch                       |           |
|      | RBITSW | Read Bitswitch                  |           |
|      | WBITSW | Write Bitswitch                 |           |
|      | RS     | Local Read BitSwitch Decoder/Driver | |
| WL   | WS     | Local Write BitSwitch Decoder/Driver | Word Line |
| BL   | WLDR   | Word Line Driver                | Bitline   |
|      | BLPC   | Bitline Precharge               |           |
|      | DEC    | Decoder                         |           |
|      | DR     | Driver                          |           |
|      | ADDR AMPS | Address Amplifiers           |           |
|      | DI     | Data In                         |           |
|      | DO     | Data Out                        |           |
|      | XA     | X-Address Input                 |           |
|      | YA     | Y-Address Input                 |           |

As shown in FIG. 1, each sub-array includes a separate read bitswitch, write bitswitch, bitline precharge circuit, local word line driver and sense amplifier. Local word line and local read and write bitswitch decoder/drivers are associated with each of the 32 sub-arrays. X address amplifiers and Y address amplifiers are coupled to the word line and bitswitch decoder/drivers and block select decoder/drivers respectively, under control of a clock signal generated from the Chip Select Not Input. Data-In amplifiers provide inputs to each of the 32 sub-arrays under control of the clock signal and the write input.

The sense amplifiers associated with each of the 32 sub-arrays are connected to data output lines via data-out latches and off-chip drivers.

The sub-array arrangement illustrated in the embodiment of FIG. 1 includes local decoding and precharging and therefore, is operable in a pipelined manner with more than one access being capable of propagating through the chip at any given time. The cycle time of the chip is limited by the sub-array cycle time. FIG. 4 illustrates what is meant by cycle time of the chip and access time of the chip. Thus, chip access time ($T_{ACC1}$, $T_{ACC2}$ etc.) is the time it takes, beginning with a given chip to be selected, for the selected chip information to appear at the chip output. The chip cycle time is the selection repetition rate which indicates when, or how frequently a chip can be selected. Cycle time is designated as 1,2,3 etc. on the horizontal axis of FIG. 4 and is shown to be less than the access time. "Cycle time" throughout the following invention description applies to either the write operation or the read operation, in any order.

Features of the chip of FIG. 1 include a chip cycle time that is less than the access time, while also having a fast access time. This is accomplished by a number of techniques.

One technique employed in FIG. 1 is that blocks in a critical path are designed such that their active plus precharge time is less than the access time of the chip. A key feature of the invention is that dynamic storage techniques are used to make it possible to achieve very fast access and precharge times. Also, a specific version of the known techniques of self-timing is used block-to-block and internally.

To reduce word line delay, the chip of FIG. 1 is segmented into 8 local word lines with the global word lines on a first level metal layer and the local word lines on a polycide layer.

The delay in developing data signals on the bitlines is reduced by segmenting the chip into 4 rows and by wiring the bitlines on a second level metal layer.

The block select decoders and driver circuits are centered to reduce metal RC delays.

Separate read and write paths are used with the write bitswitches placed at the opposite ends of the bitlines from the read bitswitches to minimize delay for both a read and write operation.

The 256K SRAM bit chip using the floor plan of FIG. 1 with sub-arrays is operated in a pipelined manner with more than one access propagating through the chip at any given time. In addition, the floor plan with inboard sense amplifiers is applicable to DRAM operation with only a slight increase in access time with the restore portion of the cycle being hidden by tne pipelined mode of operation as will be more fully described relative to the DRAM embodiment of FIG. 3.2.

As previously stated, in the floor plan for a 256K SRAM shown in FIG. 1, the chip has been partitioned into 32 128 WL×64 BL sub-arrays by making use of second layer metal. The optimum size and number of sub-arrays is influenced by chip access time requirements and array utilization. The second level of metal also makes it practical to have inboard sense amplifiers for improvement of access time by reducing the loading on the output lines. Bitswitches are used so a sense amplifier can be shared between four bit lines, reducing the loading on the sense-amp set signal, compared to having a sense-amp for each bitline. The sense amplifiers for each sub-array are self-timed locally and totally self-contained.

Each of the sub-arrays in the new floor plan is essentially self contained, with its own localized word line driver, self-timed sense amplifier circuitry and precharge circuitry. During an access only a single sub-array is activated. Having only a small fraction of the chip (1/32 for the 256K example) accessed each cycle has important ramifications for the design of a pipelined memory with more than one access propagating through the chip at a given time.

Figures 1, 3:
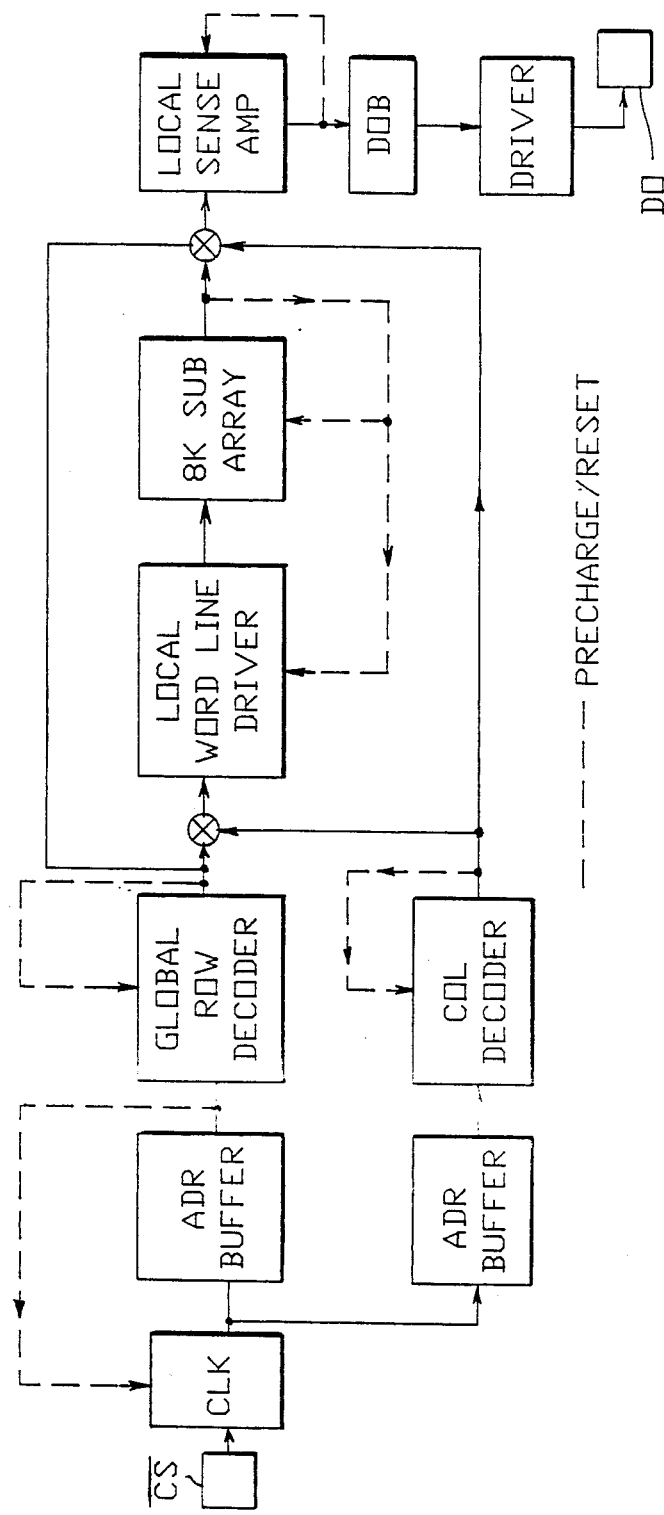
Figures 2, 3:
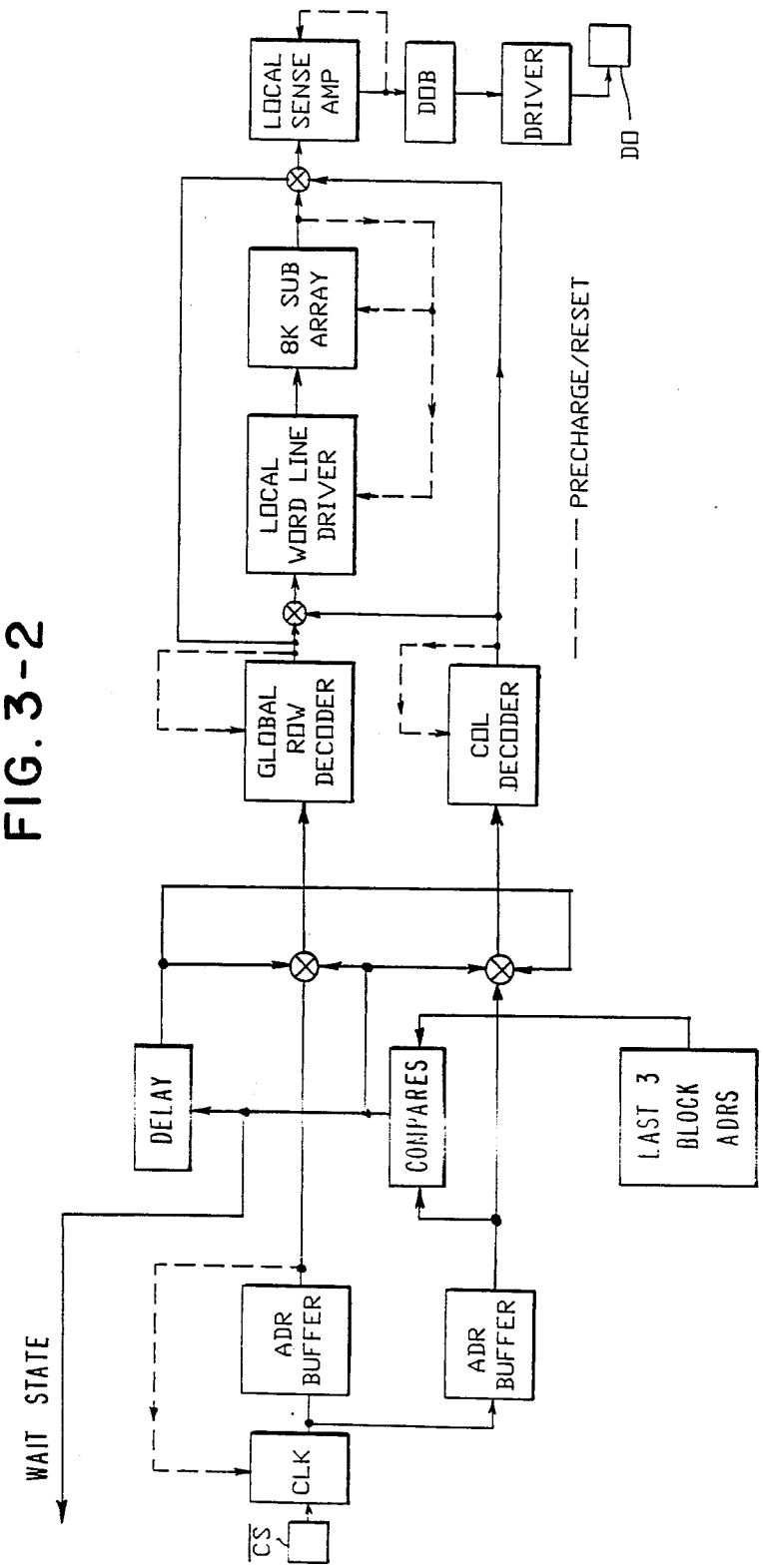
FIG. 2 is a schematic illustration of a simplified depiction of a conventional 64K semiconductor memory chip including a plurality of macros according to the prior art.

In simplified form, a prior art memory chip consists of a number of blocks or macros as shown in FIG. 2. During an access, data simply ripples from block to block with one block activating the next one and a global reset is used. In the prior art, as illustrated in FIG. 2, data "ripples" because the data from the output of one block activates the next block (i.e., well-known input triggering) but the blocks are "globally" reset by a signal generated by some other block which is fed back and resets a plurality of blocks, such as illustrated by the precharge reset connection in FIG. 2.

To achieve cycle time less than access time so the RAM can be pipelined, a localized precharge is performed as shown in FIG. 3-1 as an improvement over prior art global precharge as employed in FIG. 2. An example of the localized precharge is described in the publication by B.A. Chappell et al, in the IBM Technical Disclosure Bulletin, Vol. 30, No. 7, dated December 1987 entitled "Self-Timed Pulsed Wordline". Other examples of input triggered, self-resetting circuits are referred to in the art as address-transistion-detection circuits. With the subdivided floor plan, the precharge signal can be generated locally and the loading on the precharge clock line is not large. The 256K design has only 8K bits of sub-array which must be precharged each cycle. The sub-arrays can be considered as an array of chips with only one of them being activated each selection. The sub-arrays with their own localized word line drivers, bitswitches, self timed sense amplifiers and precharge circuits are virtually independent chips.

Additionally, each or the global blocks, external to the sub-array local circuitry, has self-timed precharge and reset circuitry. In other words, each block in the critical path shown in FIG. 3-1 is switched into the active state by tne previous blocks input signal, but is returned to its precharge/standby state by self-contained circuitry.

Being able to precharge a block very quickly after it has performed its function in anticipation of the next access is a key requirement for a memory with cycle time less than access time. The minimum time before another access can be started is the active time plus the precharge time for the slowest block in the access path. The sub-array precharge, because of the need to accurately equalize the bit lines, is difficult to accomplish in a short period of time. Thus, the chip cycle time is limited by the sub-array cycle time. A six-device CMOS cell, as used in the 256K SRAM, allows the shortest cycle time.

The floor plan of FIG. 1 with inboard sense amplifiers makes it possible to achieve almost the same access time for a Dynamic Random Access Memory (DRAM) array as an SRAM array. However, because of the need to restore the data in the accessed cell, it wili take considerably longer for the precharge portion of the cycle.

In order to operate the chip of FIG. 1 in a pipelined mode of operation for the cases where a long precharge is needed, initiation of another access to the chip is permitted as long as that access is not to the same sub-array as in the last three previous accesses. As shown in FIG. 3-2, this is accomplished by comparing the sub-array selection bits with those of the previous three accesses. If the previous accesses are to different sub-arrays resulting in a no match with the compare function, the new access would proceed while the previously accessed sub-array is being restored (thus "hiding" the restore portion of the previously accessed sub-array as it is overlapped by the new access). For the case where the compare found a match, the chip would go into a wait state until the sub-array precharge is completed and the new access is initiated.

By storing data from sequential addresses in different sub-arrays, it is possible to minimize the probability of an access to the last three accessed sub-arrays. For the 256K example given, there are 32 sub-arrays. Unless addresses were incremented by ½ word (32) increments the probability of returning on successive accesses to the last three sub-arrays accessed is small. For random accesses, the probability of accessing one of the last three sub-arrays accessed is 3/32. A compare on five of the address bits is required each access. Thus, it is possible for a memory chip with long sub-array precharge to operate in a pipelined mode the majority of the time with cycle time less than access time.

Figure 6:
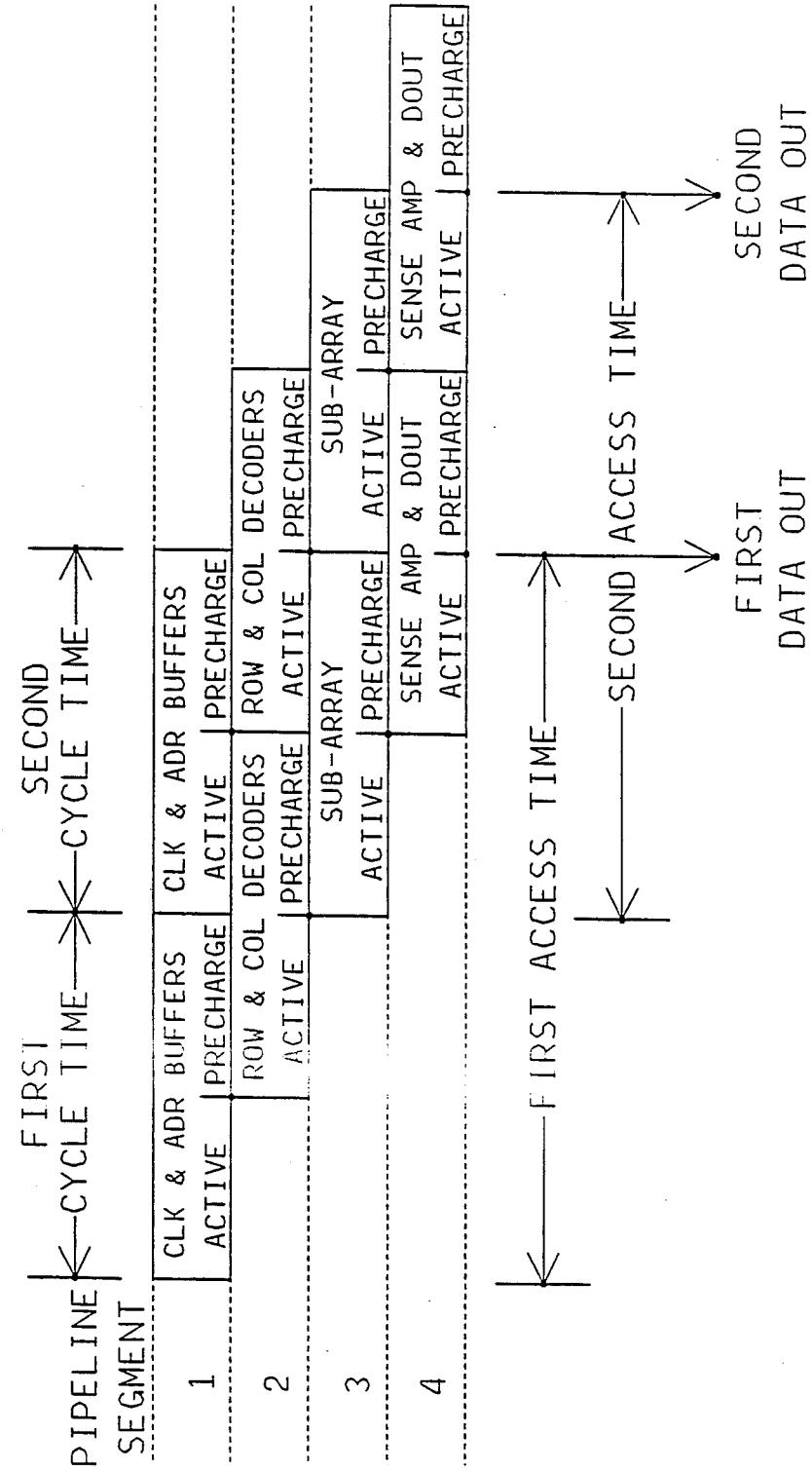

The systems implication ot a pipelined memory with cycle time less than access time can be understood by considering the timing diagram of FIG. 4 and FIG. 5 and the pipeline segment block diagrams of FIG. 6 and FIG. 7. Two cases are considered. The first in FIG. 4 and FIG. 6, assumes that the active plus precharge times of each block is less than ½ the access time. Therefore, the chip can be pipelined with a cycle time of ½ the access time for both a read and a write. No comparisons are needed on incoming addresses. For this case the bandwidth of the chip is twice what it would be for a chip with access time=cycle time that is not pipelined.

The second case (FIG. 5 and FIG. 7) assumes that the active plus precharge time of the slowest block (the sub-array) is twice the access time and that all other blocks are less than ½ the access time. It is also assumed that comparisons are done on incoming address to check whether or not the access is to a sub-array accessed on one of the last three cycles. For the case where the access is not to one of these same sub-arrays and there is no match on the compare, the chip will run in a pipelined mode with a cycle time of ½ the access time. If the access is to one of these same sub-arrays, there will be a match on the incoming address and the cycle trme will be extended. Therefore, the bandwidth for this pipelined case compared to a chip that is not pipelined but has the same access time and a cycle time of twice the access time is $$BW \approx BW_0 \left(1 + \left(\frac{TNA - AC}{TNA}\right) \times 3\right) \quad (1)$$

where
BW$_o$=band width without pipelining
BW=band width with pipelining
TNA=total number of accesses
AC=accesses with compare.

If the accesses are random in nature, the bandwidth can be given by $$BW \approx BW_o(1 + (1 - P_c) \times 3) \quad (2)$$

$$BW \approx BW_o \left(1 + \left(\frac{NSA - 3}{NSA}\right) \times 3\right) \quad (3)$$

where
P$_c$=probability of a compare
NSA=number of sub-arrays.

Thus for either random or sequential addresses one should see almost a four times increase in bandwidth compared to a conventional chip. For a DRAM, the amount of time a chip is not available because of refreshing would be reduced by this same factor.

Thus, two approaches to the design of a pipelined memory chip with cycle time less than access time using a floor plan with sub-arrays have been described. The first approach assumes the active plus precharge portions of each block is less than the access time. In the second approach, it is assumed that the active plus precharge portions of the sub-array block is greater than the access time, and that the active plus precharge portions of the rest of the blocks is less than the access time. For both cases, a substantial increase in memory chip bandwidth is possible in memory systems using SRAM and DRAM chips.

Having thus described our invention, what we claim as new, and desire to secure by Letters Patent is:

1. A pipelined semiconductor $2^n$ Kbit memory chip, n being an integer not less than 2, said chip being segmented into a plurality of $2^{n-y}$ memory sub-arrays of $2^y$ Kbits arranged in columns and rows on said chip, each one of said $2^{n-y}$ memory sub-arrays includes a separate associated word line driver circuit means, sense amplifier circuit means and independent precharge circuit means connected thereto, each of said independent precharge circuit means of each of said segmented memory sub-arrays providing local self-timed reset and precharge function for each segmented memory array independent of said other of said plurality of $2^{n-y}$ memory arrays, wherein said memory chip exhibits an access time t for providing data from said memory chip and wherein said local reset and precharge circuits of each of said segmented memory sub-arrays provides a cycle time for each sub-array which is less than chip access time t.

2. A pipelined semiconductor $2^n$ Kbit memory chip according to claim 1 wherein said segmented memory sub-arrays including independent local decoding and precharging means operate in a pipelined manner with greater than one access propagating through said $2^n$ Kbit memory chip at one time.

3. A pipelined semiconductor $2^n$ Kbit memory chip according to claim 2 further including row and column address circuits disposed on said chip connected to said word line and bitswitch decoder/driver circuit means and responsive to input address access signals for selecting ones of said $2^{n-y}$ segmented memory sub-arrays for access.

4. A pipelined semiconductor $2^n$ Kbit memory chip according to claim 1 further including compare circuits for comparing at least two signals for determining said sub-arrays being accessed by separate access signals.

5. A pipelined semiconductor $2^n$ Kbit memory chip according to claim 1 wherein said memory chip exhibits an access time t, further including global blocks on said chip external to said sub-arrays each containing clock circuit means, address buffer means, row decoder means, data output buffer means and word driver means associated with said plurality of sub-arrays, each of said global blocks including separate reset and precharge circuit means for providing a cycle time for each of said global blocks which is less than chip access time t.

* * * * *